US012550385B2

(12) United States Patent
Mochizuki et al.

(10) Patent No.: US 12,550,385 B2
(45) Date of Patent: Feb. 10, 2026

(54) CONTACT RESISTANCE OF NANOSHEET TRANSISTOR

(71) Applicant: INTERNATIONAL BUSINESS MACHINES CORPORATION, Armonk, NY (US)

(72) Inventors: Shogo Mochizuki, Mechanicville, NY (US); Su Chen Fan, Cohoes, NY (US); Nicolas Jean Loubet, Guilderland, NY (US); Xuan Liu, Clifton Park, NY (US)

(73) Assignee: International Business Machines Corporation

( * ) Notice: Subject to any disclaimer, the term of this patent is extended or adjusted under 35 U.S.C. 154(b) by 790 days.

(21) Appl. No.: 17/653,476

(22) Filed: Mar. 4, 2022

(65) Prior Publication Data

US 2023/0282748 A1 Sep. 7, 2023

(51) Int. Cl.
*H10D 30/69* (2025.01)
*H01L 21/02* (2006.01)
*H01L 21/285* (2006.01)
*H10D 30/01* (2025.01)
*H10D 30/67* (2025.01)

(Continued)

(52) U.S. Cl.
CPC ..... *H10D 30/794* (2025.01); *H01L 21/02532* (2013.01); *H01L 21/0259* (2013.01); *H01L 21/28568* (2013.01); *H10D 30/031* (2025.01); *H10D 30/6713* (2025.01); *H10D 30/6735* (2025.01); *H10D 30/6757* (2025.01); *H10D 62/118* (2025.01); *H10D 64/60* (2025.01); *H10D 64/62* (2025.01)

(58) Field of Classification Search
CPC ........... H01L 29/7845; H01L 21/02532; H01L 21/0259; H01L 21/28568; H01L 29/0665; H01L 29/42392; H01L 29/45; H01L 29/66742; H01L 29/78618; H01L 29/78696; H01L 29/0673; H01L 29/41766; H01L 29/66439; H01L 29/775; H01L 23/485; H01L 29/165; H01L 29/66545; H01L 29/7848; B82Y 10/00; H10D 30/6713; H10D 30/6735; H10D 62/121

See application file for complete search history.

(56) References Cited

U.S. PATENT DOCUMENTS 9,570,609 B2  2/2017  Obradovic
9,847,390 B1  12/2017  Xie
(Continued)

OTHER PUBLICATIONS

Henderson, Christopher; Chemical Vapor Deposition—Epitaxy Part 1; Infotracks-Semitracks Monthly Newsletter, Feb. 2017 (Year: 2017).*

(Continued)

*Primary Examiner* — Britt Hanley
*Assistant Examiner* — Jason James Greaving
(74) *Attorney, Agent, or Firm* — Yuanmin Cai

(57) ABSTRACT

Embodiments of present invention provide a semiconductor device. The semiconductor structure includes a plurality of nanosheet (NS) channel layers having a plurality of source/drain (S/D) regions on sidewalls thereof; and a continuous contact via being in direct contact with the plurality of S/D regions, wherein the continuous contact via has a substantially same horizontal distance to each of the plurality of NS channel layers. A method of manufacturing the same is also provided.

19 Claims, 10 Drawing Sheets

(51) Int. Cl.
  *H10D 62/10* (2025.01)
  *H10D 64/60* (2025.01)
  *H10D 64/62* (2025.01)

(56) References Cited

U.S. PATENT DOCUMENTS

| | | |
|---|---|---|
| 10,211,307 B2 | 2/2019 | Ching |
| 10,243,060 B2 | 3/2019 | Chao |
| 10,529,830 B2 | 1/2020 | Tapily |
| 10,832,907 B2 | 11/2020 | Cheng |
| 2005/0199945 A1* | 9/2005 | Kodama ............. H01L 29/7881 |
| | | 257/E29.302 |
| 2017/0365604 A1* | 12/2017 | Suh ................. H01L 21/823878 |
| 2020/0052079 A1* | 2/2020 | Li ..................... H01L 29/78642 |
| 2020/0075718 A1 | 3/2020 | Wang |
| 2020/0105871 A1* | 4/2020 | Glass ................ H01L 29/66772 |
| 2021/0193797 A1* | 6/2021 | Xie ....................... H01L 21/762 |
| 2021/0376093 A1* | 12/2021 | Chu .................. H01L 29/42392 |
| 2022/0359208 A1* | 11/2022 | Lin ..................... H10D 62/118 |

OTHER PUBLICATIONS

Barraud et al., "7-Levels-Stacked Nanosheet GAA Transistors for High Performance Computing", 2020 Symposium on VLSI Technology Digest of Technical Papers, 2020 IEEE, pp. 2.
Oh et al., "The Effect of Tungsten Volume on Residual Stress and Cell Characteristics in MONOS," IEEE Journal of the Electron Devices Society, vol. 7, 2019, pp. 382-387.

* cited by examiner

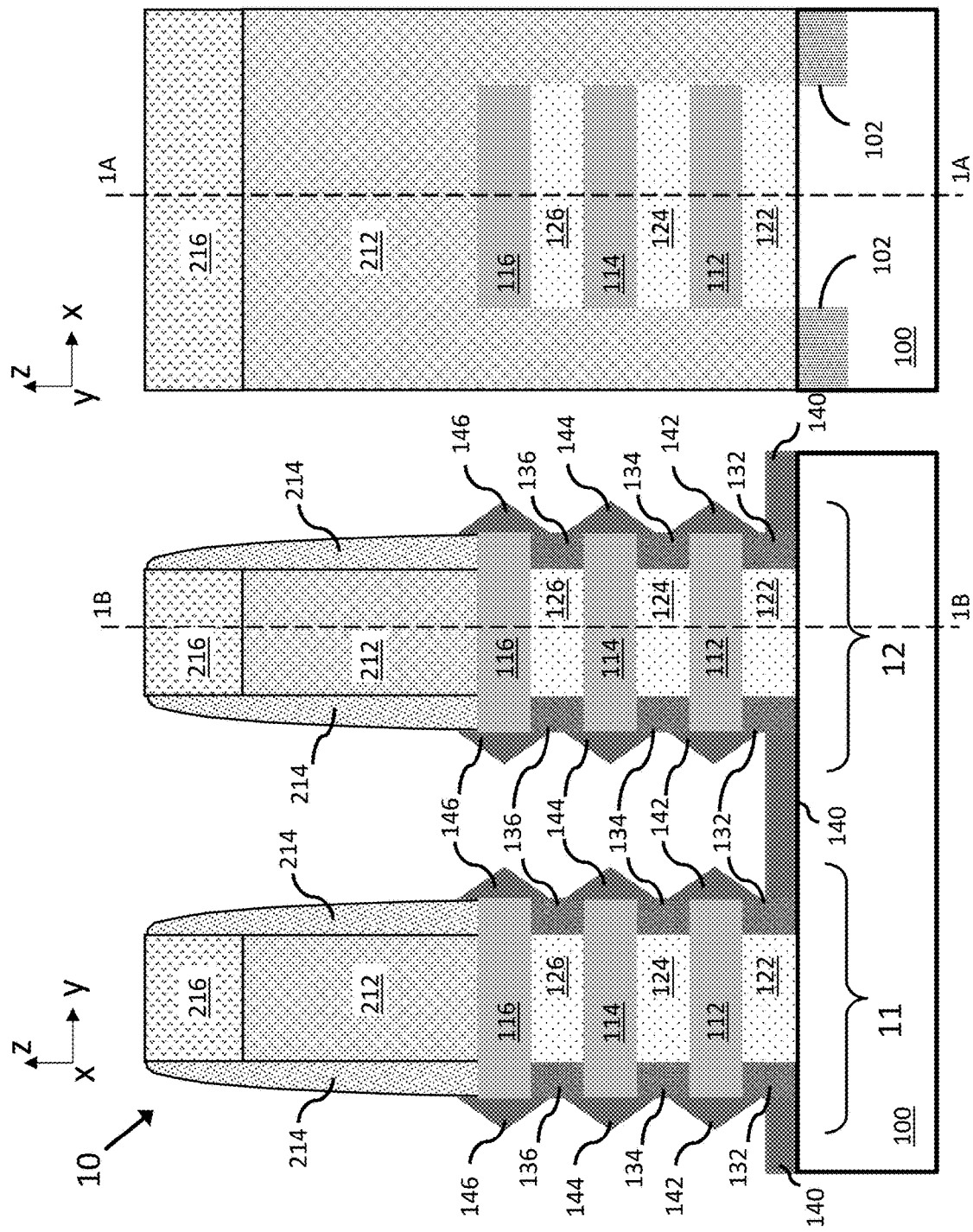

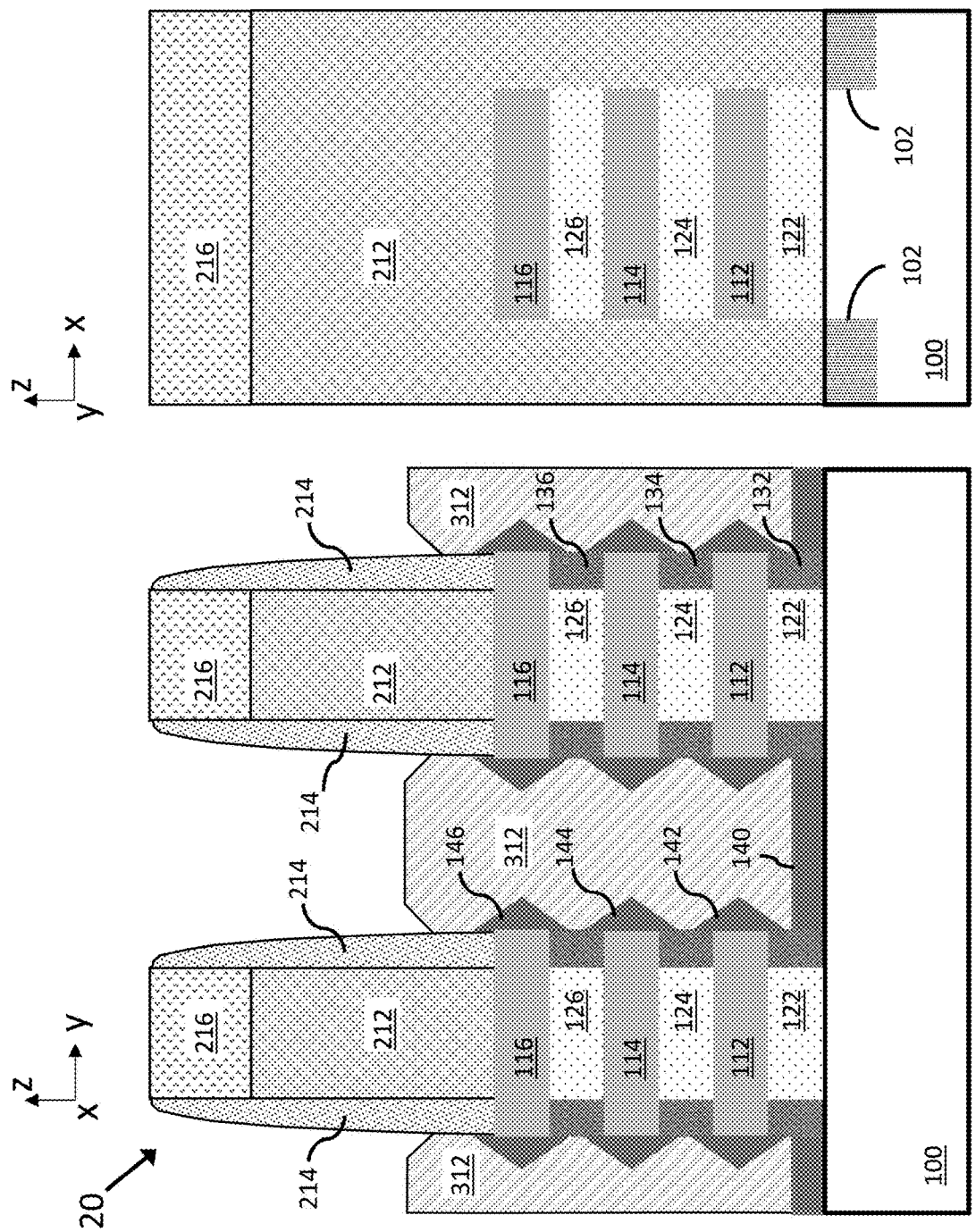

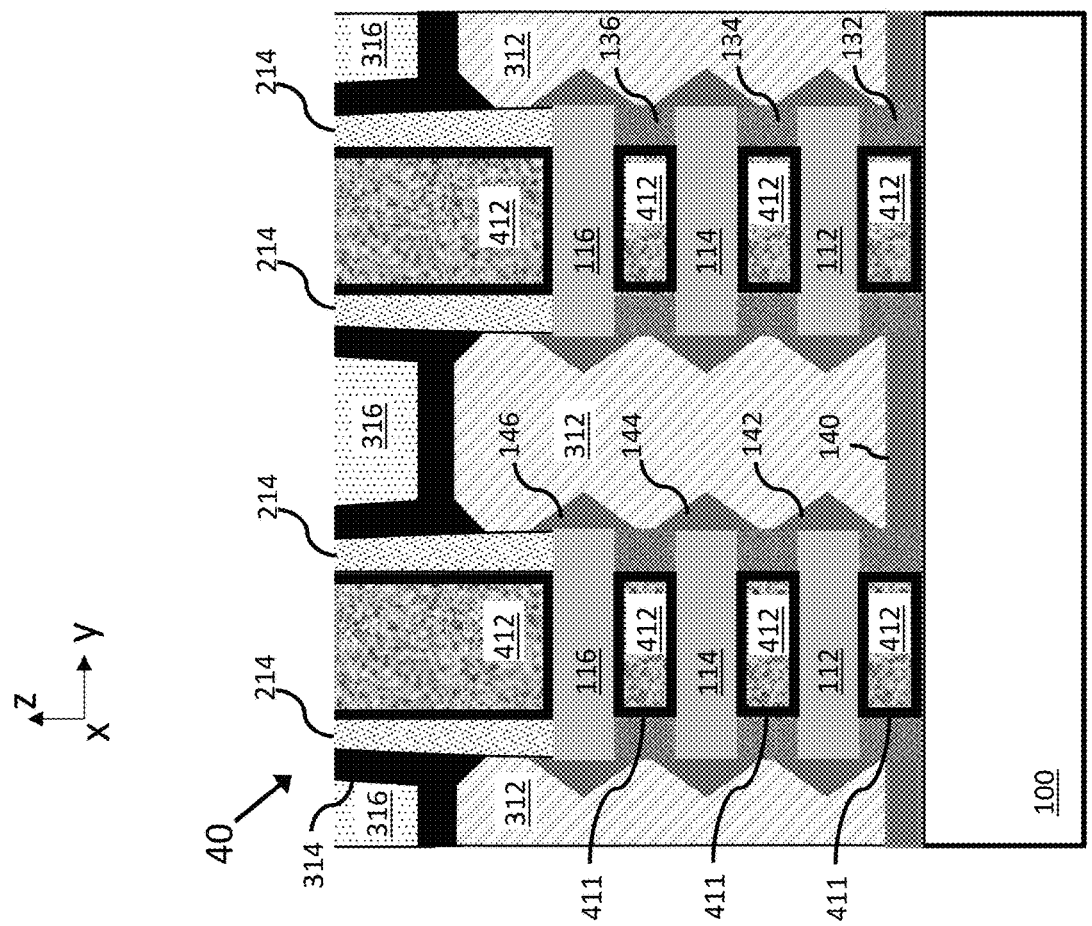
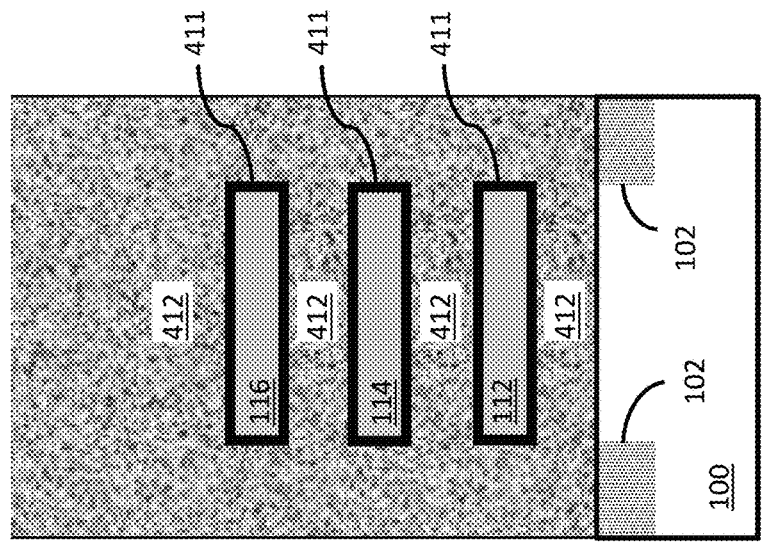
FIG. 4A
FIG. 4B

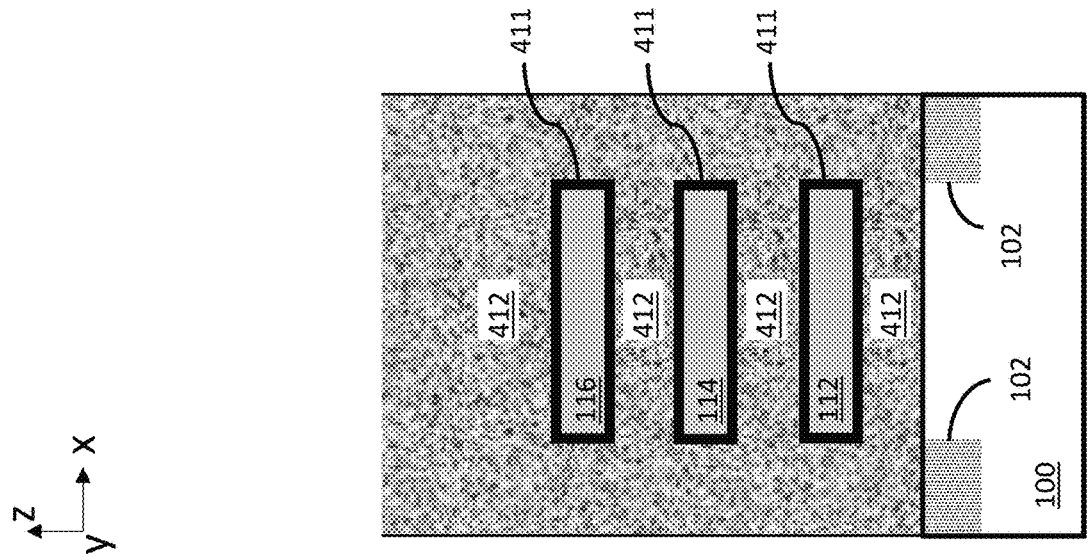
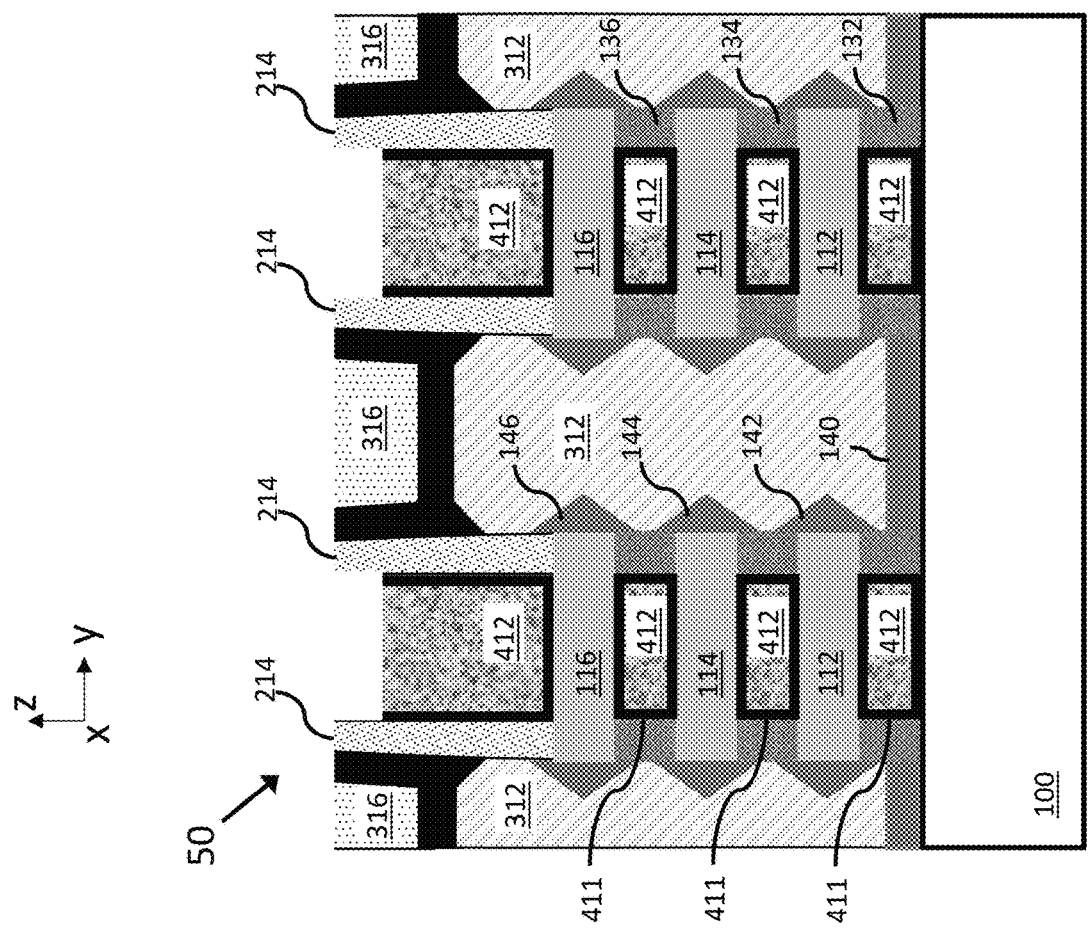
FIG. 5A
FIG. 5B

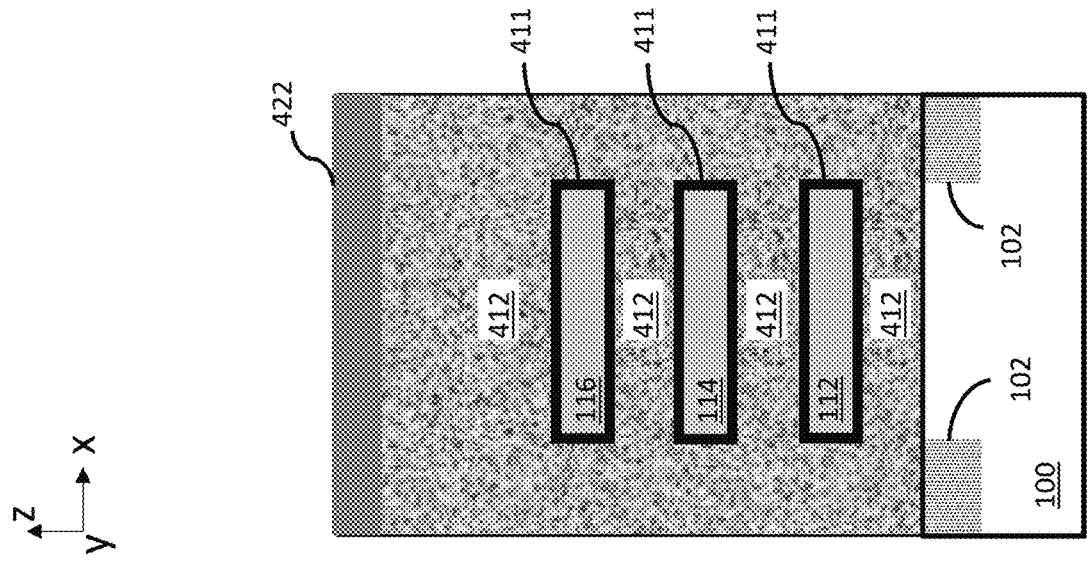
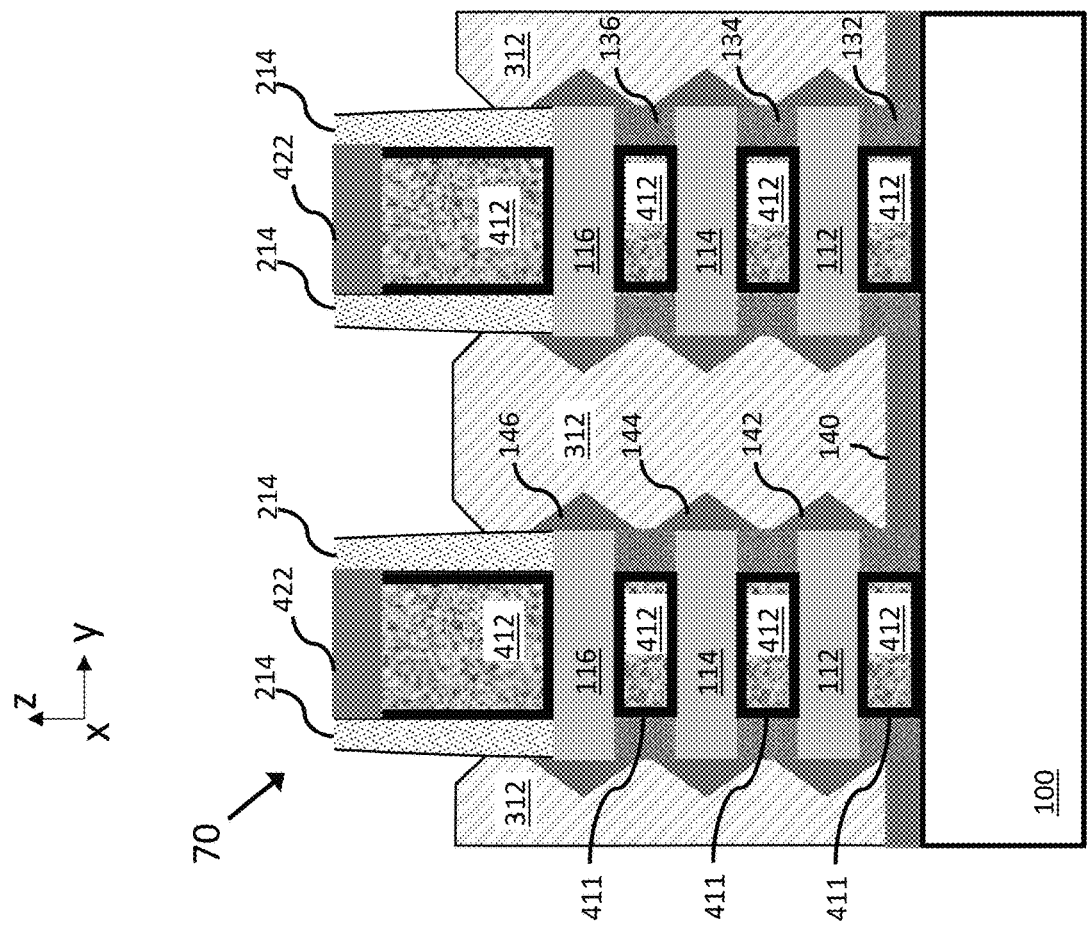

CONTACT RESISTANCE OF NANOSHEET TRANSISTOR

FIELD OF THE INVENTION

The present application relates to manufacturing of semiconductor integrated circuits. More particularly, it relates to nanosheet transistor with reduced external resistance and strained channel region, and method of manufacturing the same.

BACKGROUND

As semiconductor industry moves towards smaller node, for example 7-nm node and beyond, field-effect-transistors (FETs) are aggressively scaled in order to fit into the reduced footprint or real estate, as defined by the node, with increased device density. Among various types of FETs, non-planar FETs such as nanosheet FETs, and its variance of nanowire FETs, are particularly suited to meet this continued device scaling needs.

A nanosheet FET generally has a channel region that includes one or more elongated semiconductor layers in a stacked configuration, wherein each such semiconductor layer is known as a nanosheet layer (or nanosheet channel) and has a width that in general is substantially greater than a thickness of the nanosheet layer. A variance of this nanosheet FET may include a nanowire FET wherein the width of the nanosheet layer is substantially the same or slightly larger than the thickness of the nanosheet layer. In other words, in the event that the width of a nanosheet layer becomes more or less the same as its thickness, the nanosheet layer effectively becomes a nanowire.

In a nanosheet FET, gate material is generally formed to surround all sides of each of the stacked nanosheet layers, therefore the nanosheet FET may also be referred to as a gate-all-around (GAA) FET or GAA nanosheet FET. Source and drain of the nanosheet FET are formed at the two ends of the nanosheet layers and access to the source and drain are made through metal contacts formed above the source/drain regions.

One issue with current nanosheet FET or GAA nanosheet FET is the non-uniform access resistance to each of the nanosheet layers or nanosheet channels. For example, a top layer of the nanosheet layers generally has a short distance to the metal contact formed on top of the source/drain regions therefore having a smaller resistance, which is generally proportional to the distance. On the other hand, a bottom layer of the nanosheet layers has a long distance, relative to that of the top layer, and thus may have a bigger resistance. Moreover, due to free surface growth without template as well as crystalline defects (such as stacking fault, dislocation, etc. which may be introduced during source/drain epitaxial growth), current nanosheet FET or GAA nanosheet FET generally suffers both elastic and plastic strain relaxation in the silicon-germanium (SiGe) source/drain region, which may be doped with boron (SiGe:B), resulting device performance degradation.

SUMMARY

Embodiments of present invention provide a semiconductor structure. The semiconductor structure includes a plurality of nanosheet (NS) channel layers having a plurality of source/drain (S/D) regions on sidewalls of the plurality of NS channel layers; and a continuous contact via being in direct contact with the plurality of S/D regions, wherein the continuous contact via has a substantially same horizontal distance to each of the plurality of NS channel layers.

According to one embodiment, the continuous contact via includes a metal via stressor that applies stress towards the plurality of S/D regions on the sidewalls of the plurality of NS channel layers. In one embodiment, the metal via stressor is tungsten (W), cobalt (Co), ruthenium (Ru), or molybdenum (Mo) next to the plurality of S/D regions on the sidewalls of the plurality of NS channel layers, wherein the W, Co, Ru, or Mo are deposited under a pre-determined condition that results the stress to be a compressive stress or a tensile stress. In another embodiment, the pre-determined condition includes a range condition of argon pressure during the deposition of W, Co, Ru, or Mo next to the plurality of S/D regions.

According to another embodiment, the plurality of NS channel layers includes a plurality of silicon (Si) layers, and the plurality of S/D regions includes a plurality of silicon-germanium (SiGe) regions epitaxially formed on sidewall surfaces of the plurality of Si layers. In one embodiment, the plurality of S/D regions are a plurality of un-merged silicon-germanium (SiGe) regions epitaxially formed on the sidewalls of the plurality of NS channel layers.

Embodiments of present invention also provide a method of forming a semiconductor structure. The method includes forming a plurality of nanosheet (NS) channel layers and a plurality of source/drain (S/D) regions on sidewalls of the NS channel layers; and forming a continuous contact via in direct contact with the plurality of S/D regions, wherein the continuous contact via has a substantially same horizontal distance to each of the plurality of NS channel layers.

According to one embodiment, forming the continuous contact via includes depositing tungsten (W), cobalt (Co), ruthenium (Ru), or molybdenum (Mo), in a physical vapor deposition (PVD) process, under a pre-determined condition, directly next to the plurality of S/D regions on the sidewalls of the plurality of NS channel layers such that the continuous contact via exerts a compressive stress or a tensile stress towards the plurality of S/D regions. In one embodiment, the pre-determined condition includes a range condition of argon pressure during the PVD process of forming the continuous contact via.

According to another embodiment, forming the plurality of NS channel layers includes forming a plurality of silicon (Si) layers alternatingly stacked with a plurality of silicon-germanium (SiGe) layers and forming inner sidewall spacers at two ends of the plurality of SiGe layers.

According to one embodiment, forming the plurality of S/D regions includes epitaxially growing the plurality of SiGe regions on the sidewalls of the plurality of NS channel layers, wherein SiGe regions of the plurality of SiGe regions are un-merged with each other.

In one or more embodiments, the method further includes forming a merged sacrificial S/D layer covering a plurality of S/D regions; removing the plurality of SiGe layers to expose the plurality of Si layers, forming a gate dielectric layer covering the exposed plurality of Si layers, and forming a gate metal over the gate electric layer surrounding the plurality of Si layers; forming a dielectric cap layer on top of the gate metal; and removing the merged sacrificial S/D layer to expose the un-merged plurality of S/D regions before forming the continuous contact via.

BRIEF DESCRIPTION OF THE DRAWINGS

The present invention will be understood and appreciated more fully from the following detailed description of embodiments of the invention, taken in conjunction with accompanying drawings of which:

FIGS. 1A-9B are demonstrative illustrations of cross-sectional views of a nanosheet FET during a process of manufacturing thereof in accordance with one or more embodiments of present invention.

Figures 3A, 3B:
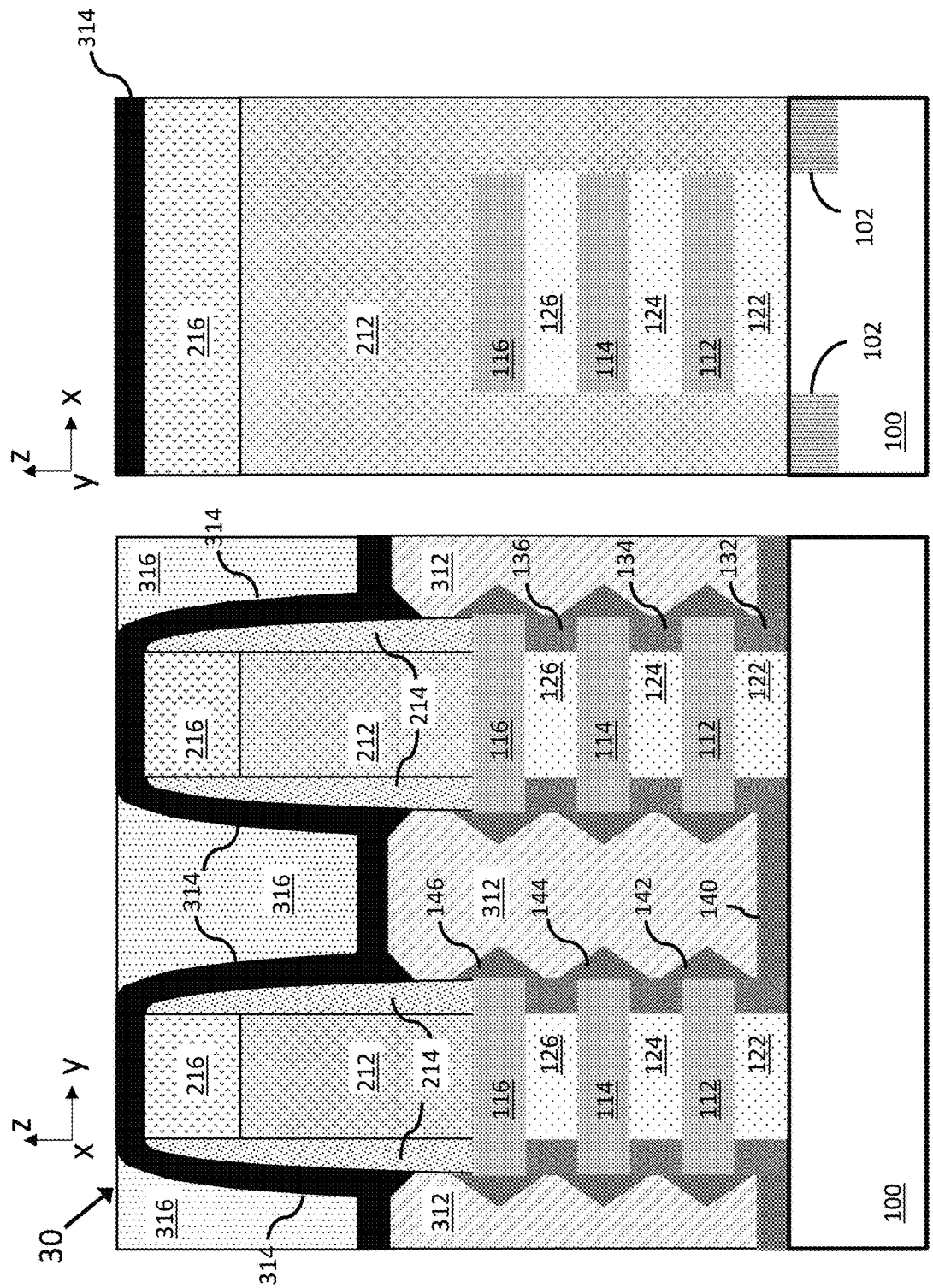

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity or they are embodied in a single physical entity.

DETAILED DESCRIPTION OF PREFERRED EMBODIMENTS

In the below detailed description and the accompanying drawings, it is to be understood that various layers, structures, and regions shown in the drawings are both demonstrative and schematic illustrations that are not drawn to scale. In addition, for the ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures may not be repeated for each of the drawings. Wherever it is sufficiently clear or obvious, the same or similar reference numbers may not be shown or repeated for the same or similar features, elements, or structures in all the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to the different structural orientations of the semiconductor structures shown throughout the drawings, XYZ Cartesian coordinates may be shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIGS. 1A through 9B are demonstrative illustrations of cross-sectional views of a nanosheet FET during a process of manufacturing thereof in accordance with one or more embodiments of present invention. The nanosheet FET may be a GAA nanosheet FET but may be referred to hereinafter as, for simplicity purpose, nanosheet FET. The figures illustrate respective cross-sectional views of a portion of the nanosheet FET as it undergoes sequential processing operations as part of the manufacturing process. Although exemplary embodiments of present invention are discussed in the context of nanosheet FET, it is to be understood that fabrication techniques discussed herein are readily applicable to other types of FET devices such as, for example, nanowire FET.

FIGS. 1A and 1B demonstratively illustrates a cross-sectional view of a semiconductor structure 10 during a process of manufacturing a nanosheet FET in accordance with one or more embodiments of a method of present invention. In particular, FIG. 1A illustrates a cross-sectional view (Y-Z plane) of semiconductor structure 10 in a cross-gate direction along line 1A-1A as indicated in FIG. 1B, and FIG. 1B illustrates a cross-sectional view (X-Z plane) of semiconductor structure 10 in a cross-nanosheet direction along line 1B-1B as indicated in FIG. 1A of the nanosheet FET.

As illustrated in FIGS. 1A and 1B, embodiment of present invention provides a method or process by forming one or more nanosheet FETs 11 and 12 on a semiconductor substrate 100. As being illustrated in FIG. 1B, nanosheet FETs 11 and 12 may be separated and/or isolated from other active devices in semiconductor substrate 100 by one or more shallow trench isolation (STI) 102. A nanosheet FET, for example nanosheet FET 11, may include a plurality of nanosheet channel layers 112, 114, and 116 that are separated by a plurality of nanosheet sacrificial layers 122, 124, and 126. In other words, nanosheet FET 11 may include a stack of alternating nanosheet (NS) channel layers (112, 114, and 116) and NS sacrificial layers (122, 124, and 126).

Semiconductor substrate 100 may be, in one embodiment, a bulk semiconductor substrate such as a silicon (Si) substrate, a germanium (Ge) substrate, a silicon-germanium (SiGe) alloy, or a compound semiconductor material (e.g., III-V semiconductor material). However, embodiments of present invention are not limited in this aspect and semiconductor substrate 100 may be, in another embodiment, a silicon-on-insulator (SOI) substrate, a germanium-on-insulator (GeOI) substrate, or other semiconductor-on-insulator substrate. A semiconductor-on-insulator substrate generally refers to a substrate structure wherein an insulating layer (e.g., an oxide layer) is disposed between a bulk substrate (e.g., a Si substrate) and an active semiconductor layer (e.g., a Ge, SiGe, layer etc.).

NS channel layers 112, 114, and 116 and NS sacrificial layers 122, 124, and 126 may be epitaxial semiconductor layers, and may be epitaxially grown using currently known or future developed methods or techniques. Such methods or techniques may include, but are not limited to, chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow.

NS channel layers 112, 114, and 116 and NS sacrificial layers 122, 124, and 126 may be formed of different types of materials, depending on many factors such as, for example, the type of nanosheet FET device (p-type, or n-type) and the desired level of etch selectivity between these semiconductor layers.

For example, in one embodiment, NS channel layers 112, 114, and 116 may be formed of epitaxial crystalline silicon (Si) and NS sacrificial layers 122, 124, and 126 may be formed of epitaxial silicon-germanium (SiGe) alloy. This allows epitaxial SiGe material of NS sacrificial layers 122, 124, and 126 to be etched away selective to epitaxial Si material of NS channel layers 112, 114, and 116 in a subsequent process step. In other embodiments, NS channel layers 112, 114, and 116 may be formed of epitaxial SiGe material with a first desired Ge concentration (optimized for device performance) level, and NS sacrificial layers 122, 124, and 126 may be formed of a sacrificial semiconductor material, e.g., epitaxial SiGe material with a second and different Ge concentration level such that NS sacrificial layers 122, 124, and 126 may be etched away selective to NS channel layers 112, 114, and 116 of the first Ge concentration level. While the nanosheet stack of nanosheet FET 11 (and 12) may be shown to include three NS channel layers 112, 114, and 116 and corresponding NS sacrificial layers 122, 124, and 126, in other embodiments, the nanosheet stack may include more or less than three NS channel layers and NS sacrificial layers.

According to one embodiment, nanosheet FET 11 (and 12) may include inner sidewall spacers 132, 134, and 136 formed at the two ends of NS sacrificial layers 122, 124, and 126. NS sacrificial layers 122, 124, and 126 may be recessed relative to NS channel layers 112, 114, and 116. In one embodiment, inner sidewall spacers 132, 134, and 136 may be formed to have a common (or aligned) sidewall surface as that of NS channel layers 112, 114, and 116. A plurality of source/drain (S/D) regions such as S/D regions 142, 144, and 146 may be formed at the two ends, or sidewalls, or sidewall surfaces of NS channel layers 112, 114, and 116 respectively. Here, it is to be understood that the term "source/drain" used herein means that a given source/drain or source/drain region can be either a source region or a drain region, depending upon the application or circuit configuration. In one embodiment, S/D regions 142, 144, and 146 may be formed to be un-merged with each other. In other words, S/D regions 142, 144, and 146 may be epitaxially grown from sidewall surfaces of their corresponding NS channel layers and the epitaxial growth may be stopped before S/D regions 142, 144, and 146 merge with each other. S/D regions 142, 144, and 146 stand separately. During the epitaxial growth of S/D regions 142, 144, and 146, an epitaxial layer 140 may also be formed on top of substrate 100 such as Si substrate 100.

In one embodiment, NS channel layers 112, 114, and 116 may be single crystalline silicon (Si) and NS sacrificial layers 122, 124, and 126 may be silicon-germanium (SiGe) that may be removed, for example in a selective etching process, as being described below in more details. In this embodiment, inner sidewall spacers 132, 134, and 136 may be silicon nitride or silicon oxide.

In addition, nanosheet FET 11 (and 12) may include a dummy gate structure formed on top of NS channel layer 116 to define a gate length of nanosheet FET 11 (and 12). For example, the dummy gate structure may include a dummy gate electrode layer 212 (e.g., sacrificial polysilicon or amorphous silicon material), a gate capping layer 216 and a pair of gate sidewall spacers 214. The pair of gate sidewall spacers 214 defines a gate region of nanosheet FET 11 (and 12). Sacrificial material such as dummy gate electrode layer 212 may be subsequently removed as part of a replacement metal gate (RMG) process and replaced with a high-k gate dielectric material and metallic material to form a HKMG gate structure for nanosheet FET 11 (and 12) as being described below in more details.

FIGS. 2A and 2B demonstratively illustrates a cross-sectional view of a semiconductor structure 20 during a process of manufacturing a nanosheet FET in accordance with one or more embodiments of a method of present invention. As illustrated in FIGS. 2A and 2B, embodiment of present invention provides a method or process by forming a sacrificial source/drain (S/D) layer 312 of nanosheet FET 11 (and 12). The sacrificial S/D layer 312 may be a merged sacrificial S/D layer and thus may also be referred to as a merged sacrificial S/D layer 312, as being described below in more details. Merged sacrificial S/D layer 312 may be formed by epitaxially growing a semiconductor material on the exposed un-merged S/D regions 142, 144, and 146, thereby covering un-merged S/D regions 142, 144, and 146. The method provides forming merged sacrificial S/D layer 312 by using known techniques such as CVD, MOCVD, LPCVD, MBE, VPE, or other known epitaxial growth techniques that are suitable for the given process flow here. Material of merged sacrificial S/D layer 312 may include, for example, pure Ge or SiGe with high Ge concentration level, such that merged sacrificial S/D layer 312 may be removed selective to un-merged S/D regions 142, 144, and 146, as being described below in more details with reference to FIG. 8.

FIGS. 3A and 3B demonstratively illustrates a cross-sectional view of a semiconductor structure 30 during a process of manufacturing a nanosheet FET in accordance with one or more embodiments of a method of present invention. As illustrated in FIGS. 3A and 3B, embodiment of present invention provides a method or process by forming a dielectric layer covering the merged sacrificial S/D layer 312. For example, following the formation of merged sacrificial S/D layer 312, the method provides forming a silicon-nitride (SiN) liner 314 covering the exposed dummy gate structure and merged sacrificial S/D layer 312. In addition, an inter-level dielectric (ILD) layer 316 may be subsequently formed on top of SiN liner 314 to encapsulate the dummy gate structure and merged sacrificial S/D layer 312. In one embodiment, ILD layer 316 may be formed by depositing a blanket layer of dielectric or insulating material over the dummy gate structure and merged sacrificial S/D layer 312, and subsequently planarizing the blanket layer of dielectric or insulating material down to gate capping layer 216 to form ILD layer 316. ILD layer 316 may be deposited using known deposition techniques, such as, for example, ALD, CVD, PECVD, PVD, or spin-on deposition. In one embodiment, the blanket layer of dielectric or insulating material may be planarized using a standard planarization process such as a chemical-mechanic-polishing (CMP) process to remove overburden dielectric or insulating material down to an upper surface of gate capping layer 216.

FIGS. 4A and 4B demonstratively illustrates a cross-sectional view of a semiconductor structure 40 during a process of manufacturing a nanosheet FET in accordance with one or more embodiments of a method of present invention. As illustrated in FIGS. 4A and 4B, embodiment of present invention provides a method or process by performing a replacement metal gate (RMG) process to replace dummy gate electrode layer 212 with a gate metal 412. For example, gate capping layer 216 may be removed by first planarizing (e.g., via CMP) the surface of semiconductor structure 30 shown in FIGS. 3A and 3B down to at least an upper surface of dummy gate electrode layer 212. In another embodiment, the dielectric material (e.g., SiN) of gate capping layer 216 may be etched away selective to the material (e.g., SiBCN) of gate sidewall spacers 214 and the material (e.g., silicon oxide) of ILD layer 316 to expose the underlying dummy gate electrode layer 212.

Dummy gate electrode layer 212 (e.g., sacrificial polysilicon or amorphous silicon material) may be etched away using known etching techniques and etch chemistries. For example, dummy gate electrode layer 212 may be removed using a selective dry etch or wet etch process with suitable etch chemistries including, for example, ammonium hydroxide and tetramethylammonium hydroxide (TMAH). Subsequently, another etch process may be performed to selectively etch away NS sacrificial layers 122, 124, and 126 of the nanosheet stack structure. NS sacrificial layers 122, 124, and 126 (e.g., SiGe layers) may be etched away selective to NS channel layers 112, 114, and 116 (e.g., Si layers) and inner sidewall spacers 132, 134, and 136 (e.g., SiO2 layer). In one embodiment, SiGe material of NS sacrificial layers 122, 124, and 126 may be selectively etched away (with high etch selectivity) using a gas phase HCl (hydrochloric acid) or wet etch solution containing hydrogen peroxide ($H_2O_2$), selective to the Si material of NS channel layers 112, 114, and 116.

Next, a high-k gate dielectric layer 411 may be formed to surround exposed NS channel layers 112, 114, and 116, which is then followed by forming a gate metal 412 to cover the high-k gate dielectric layer 411, wrapping around NS channel layers 112, 114, and 116, thereby forming a high-k metal gate (HKMG) structure.

More specifically and in one embodiment, the HKMG structure may be formed by first depositing one or more conformal high-k gate dielectric layers 411 over, and covering, the exposed surfaces of NS channel layers 112, 114, and 116. The high-k gate dielectric layers 411 may be a high-k gate dielectric material having a dielectric constant of 3.9 or greater. For example, the high-k gate dielectric material may include, but are not limited to, metal oxides such as hafnium oxide, hafnium silicon oxide, hafnium silicon oxynitride, hafnium zirconium oxide, and nitride films thereof. In other embodiments, the high-k gate dielectric material may include lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric layers 411 may further include dopants such as lanthanum or aluminum.

In another embodiment, gate metal 412 may include one or more work function metal layers including, but are not limited to, titanium nitride (TiN), tantalum nitride (TaN), and an Al-containing alloy (e.g., TiAlC, TiAl, and AlC, or nitrided alloys thereof). In other embodiments, the work function metal layer(s) may include a metallic material which includes a composition or alloy of Zr, W, Hf, Ti, Al, Ru, Pa, ZrAl, WAl, TaAl, HfAl, TaC, TiC, TaMgC, and other types, compositions, or alloys of work function metals that are commonly used to obtain target work functions which are suitable for the n-type or p-type of nanosheet FETs that are to be formed. The work function metal layers are conformally deposited using known methods such as ALD, CVD, etc., which allow for high conformality of the deposited work function metal layers.

In some embodiments, the work function metal layers of gate metal 412 completely fill the spaces above and below NS channel layers 112, 114, and 116. For example, in instances where the initial spacing between NS channel layers 112, 114 and 116 is relatively small (e.g., 7 nm to 10 nm), after formation of the high-k gate dielectric layer, the conformal deposition of a stack of one or more work function metal layers may result in filling (i.e., pinch-off) the spaces above and below NS channel layers 112, 114, and 116 such that the spaces are filled with high-k gate dielectric layer and work function metal layers.

FIGS. 5A and 5B demonstratively illustrates a cross-sectional view of a semiconductor structure 50 during a process of manufacturing a nanosheet FET in accordance with one or more embodiments of a method of present invention. As illustrated in FIGS. 5A and 5B, embodiment of present invention provides a method or process by recessing gate metal 412 and surrounding high-k gate dielectric layer or layers down to a target level below an upper surface of ILD layer 316, thereby creating recessed areas above gate metal 412.

Figures 6A, 6B:
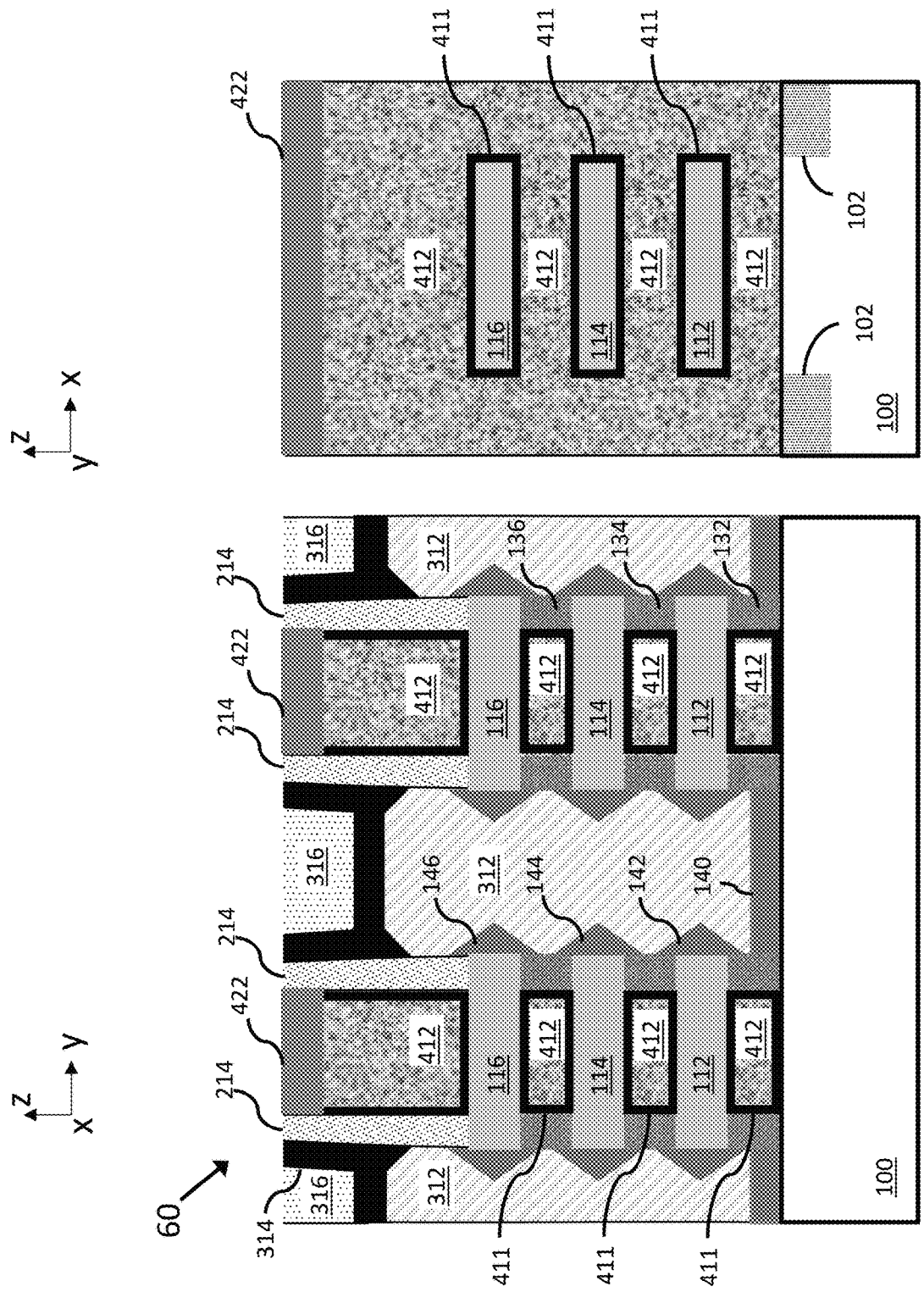

FIGS. 6A and 6B demonstratively illustrates a cross-sectional view of a semiconductor structure 60 during a process of manufacturing a nanosheet FET in accordance with one or more embodiments of a method of present invention. As illustrated in FIGS. 6A and 6B, embodiment of present invention provides a method or process of depositing a dielectric material such as, for example, silicon-nitride (SiN) or silicon-nitride doped with boron and carbon (SiBCN), in and above the recessed areas and possibly above ILD layer 316. Semiconductor structure 60 is then planarized down to the top surface of ILD layer 316 to remove overburden dielectric material, thereby forming gate capping layer 422.

FIGS. 7A and 7B demonstratively illustrates a cross-sectional view of a semiconductor structure 70 during a process of manufacturing a nanosheet FET in accordance with one or more embodiments of a method of present invention. As illustrated in FIGS. 7A and 7B, embodiment of present invention provides a method or process of removing remaining ILD layer 316 and SiN liner 314 underneath thereof, selective to the HKMG structures of gate metal 412, gate capping layer 422, and sidewall spacers 214, to expose merged sacrificial S/D layer 312.

Figures 8A, 8B:
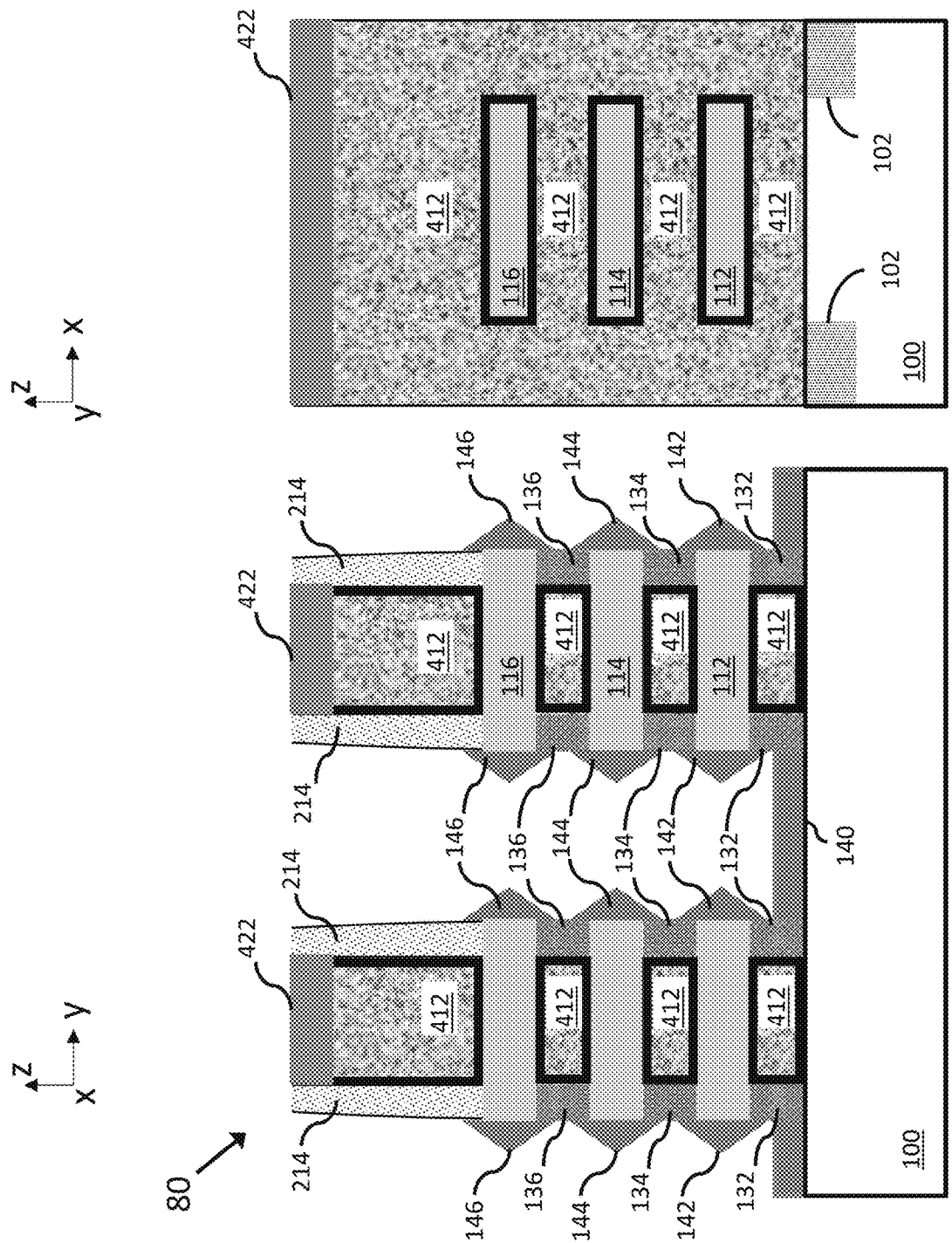

FIGS. 8A and 8B demonstratively illustrates a cross-sectional view of a semiconductor structure 80 during a process of manufacturing a nanosheet FET in accordance with one or more embodiments of a method of present invention. As illustrated in FIGS. 8A and 8B, embodiment of present invention provides a method or process of further removing merged sacrificial S/D layer 312, selective to un-merged S/D regions 142, 144, and 146, thereby exposing un-merged S/D regions 142, 144, and 146.

Figures 9A, 9B:
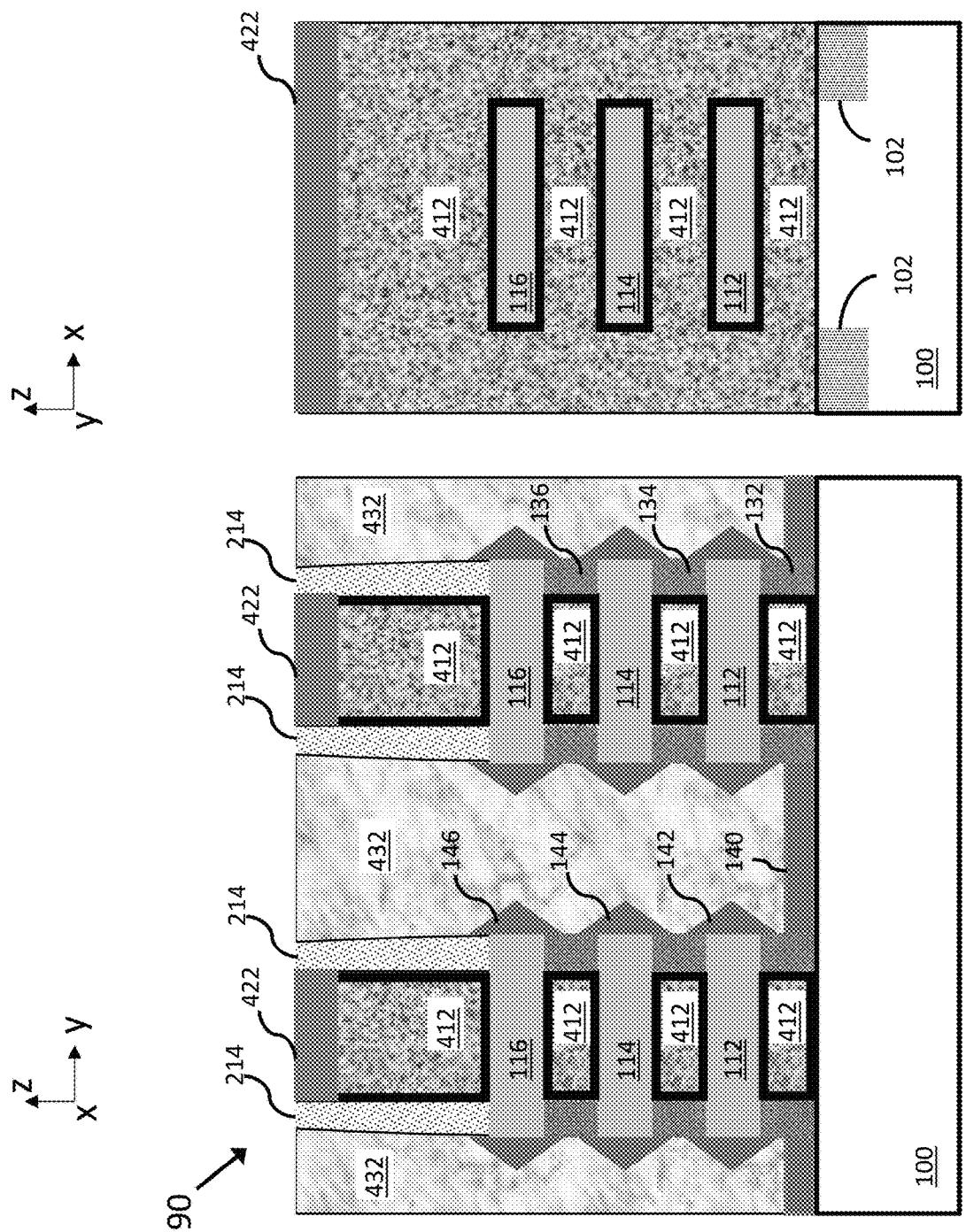

FIGS. 9A and 9B demonstratively illustrates a cross-sectional view of a semiconductor structure 90 during a process of manufacturing a nanosheet FET in accordance with one or more embodiments of a method of present invention. As illustrated in FIGS. 9A and 9B, embodiment of present invention provides a method or process by filling the spaces between, for example, nanosheet FETs 11 and 12, created by the removal of merged sacrificial S/D layer 312 with a continuous contact via 432. More specifically, the continuous contact via 432 may be formed to be in direct contact with the plurality of S/D regions 142, 144, and 146. The formed continuous contact via 432 may have a substantially same horizontal distance from the plurality of NS channel layers 112, 114, and 116.

For example, in a previous step, the plurality of S/D regions 142, 144, and 146 may be epitaxially formed from sidewall surfaces of the plurality of NS channel layers 112, 114, and 116 to have a diamond shape, illustrated here as a triangular shape, with a top thereof being most away from the sidewall surfaces of the plurality of NS channel layers 112, 114, and 116. A horizontal distance from the continuous contact via 432 to the plurality of NS channel layers 112, 114, and 116 may be defined as a measured distance from the sidewall surfaces of the plurality of NS channel layers 112, 114, and 116 to the top of the diamond shapes of un-merged S/D regions 142, 144, and 146.

The continuous contact via 432 may be a metal contact via of tungsten (W), cobalt (Co), ruthenium (Ru), or molybdenum (Mo). In one embodiment, the metal contact via may be deposited in a physical vapor deposition (PVD) process and the PVD process may be performed in an argon (Ar) ambient environment of certain pressure. For example, in one embodiment, the argon pressure may be controlled, adjusted, or maintained at a first range, for example between 0.5 Pa and 2.5 Pa, such that the resulting continuous contact via 432, for example a metal contact via of W, may behave or function as a metal via stressor as well and may exert a compressive stress towards NS channel layers 112, 114 and 116. In another embodiment, the argon pressure may be controlled, adjusted, or maintained at a second range, for example between 2.5 Pa and 5.0 Pa, such that the resulting continuous contact via 432, for example a metal contact via of W, may behave or function as a metal via stressor and may exert a tensile stress towards NS channel layers 112, 114, and 116.

Figure 10:
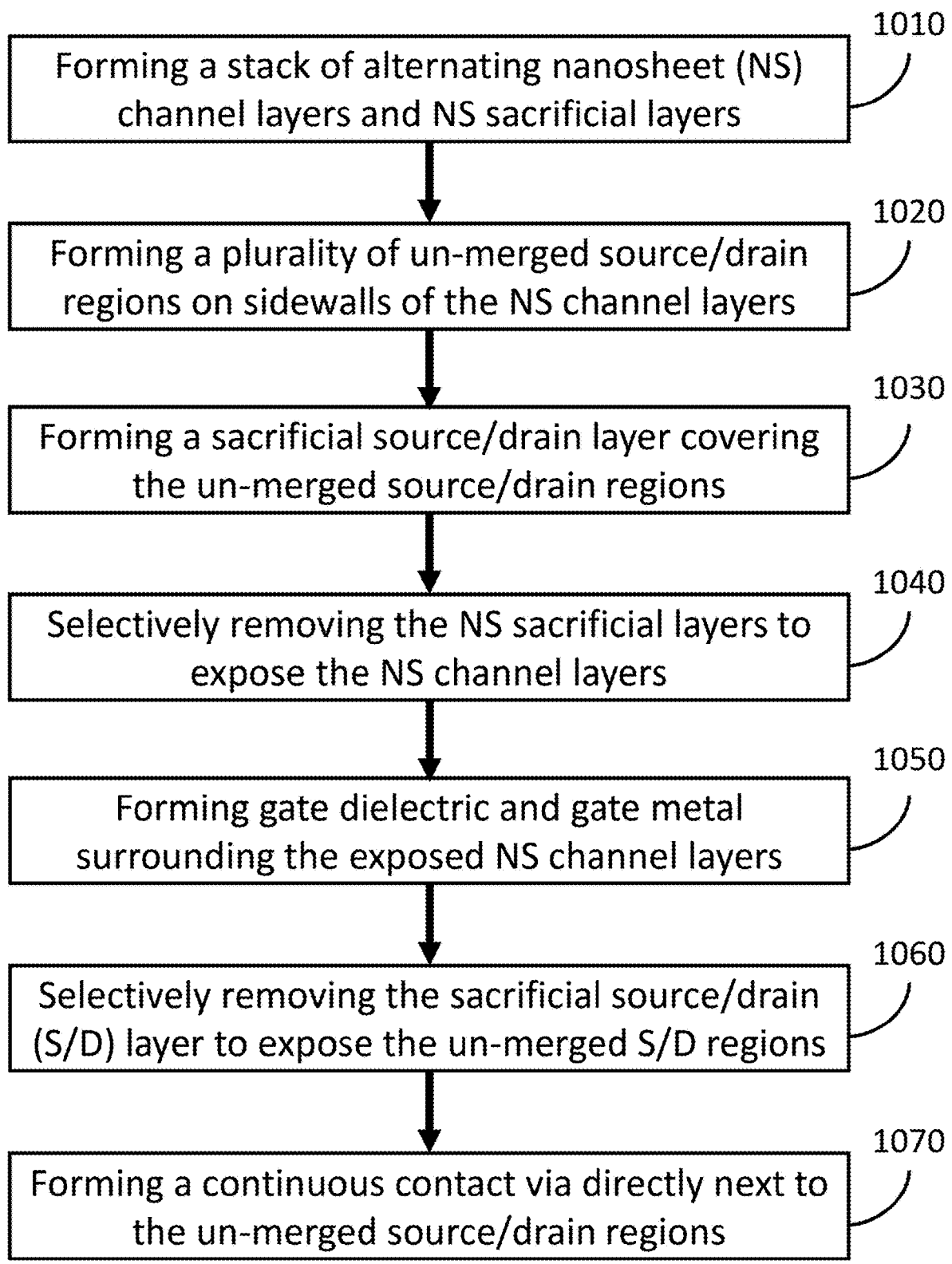
FIG. 10 is a demonstrative illustration of a flow-chart of a method of manufacturing a nanosheet FET in accordance with one or more embodiments of present invention.

FIG. 10 is a demonstrative illustration of a flow-chart of a method of manufacturing a nanosheet FET in accordance with one or more embodiments of present invention. More specifically, the method may include (1010) forming a stack of alternating nanosheet (NS) channel layers and NS sacrificial layers. In other words, the method may include forming a plurality of NS channel layers to be alternatingly stacked with a plurality of NS sacrificial layers. The method may include (1020) epitaxially forming a plurality of un-merged source/drain regions on sidewall surfaces of their corresponding plurality of NS channel layers. The plurality of un-merged source/drain regions may have a diamond shape with a substantially same height measured from the sidewall surfaces of the plurality of NS channel layers. In other words, a distance from a top of the diamond shape to the bottom thereof, which is the sidewall surfaces of the NS channel layers, may be substantially the same among the plurality of un-merged source/drain regions. The method may then include (1030) forming a sacrificial source/drain layer directly adjacent to and covering the un-merged source/drain regions. The sacrificial source/drain layer may be a merged source/drain layer, unlike the un-merged source/drain regions, which may be sacrificial to be removed in one of the subsequent steps. The method may subsequently move to forming high-k metal gate (HKMG) structures for the nanosheet FET. In doing so, the method may include (1040) selectively removing the NS sacrificial layers between the NS channel layers to expose the NS channel layers and include (1050) forming a gate dielectric layer and one or more work-function metal layers, collectively referred to herein as gate metal, over and surrounding the exposed NS channel layers thereby forming a gate-all-around (GAA) structure. The method may then provide (1060) selectively removing the merged sacrificial source/drain layer to expose the underneath un-merged source/drain regions. After the un-merged source/drain regions are exposed, the method may include (1070) forming a continuous contact via directly next to the un-merged source/drain regions. The forming of continuous contact via may include depositing tungsten (W), cobalt (Co), ruthenium (Ru), or molybdenum (Mo), directly next to the un-merged source/drain regions. By controlling and/or adjusting an argon ambient environment of a certain pressure range, for example during the deposition of tungsten (W), cobalt (Co), ruthenium (Ru), or molybdenum (Mo), the deposited continuous contact via may behave or function as a metal via stressor that may exert either a compressive stress or a tensile stress towards the NS channel layers. In one embodiment, a horizontal distance measured from the continuous contact via to the plurality of NS channel layers may be substantially the same.

It is to be understood that the exemplary methods discussed herein may be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

It is to be understood that the various layers, structures, and/or regions described above are not necessarily drawn to scale. In addition, for ease of explanation one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular processing steps shown and described herein. In particular, with respect to semiconductor processing steps, it is to be emphasized that the descriptions provided herein are not intended to encompass all of the processing steps that may be used to form a functional semiconductor integrated circuit device. Rather, certain processing steps that are commonly used in forming semiconductor devices, such as, for example, wet cleaning and annealing steps, are purposefully not described herein for economy of description.

Terms such as "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Also, in the figures, the illustrated scale of one layer, structure, and/or region relative to another layer, structure, and/or region is not necessarily intended to represent actual scale.

Semiconductor devices and methods for forming the same in accordance with the above-described techniques can be employed in various applications, hardware, and/or electronic systems, including but not limited to personal computers, communication networks, electronic commerce systems, portable communications devices (e.g., cell and smart phones), solid-state media storage devices, functional circuitry, etc. Given the teachings provided herein, one of ordinary skill in the art will be able to contemplate other implementations and applications of embodiments of the invention.

In some embodiments, the above-described techniques are used in connection with manufacture of semiconductor integrated circuit devices that illustratively comprise, by way of non-limiting example, CMOS devices, MOSFET devices, and/or FinFET devices, and/or other types of semiconductor integrated circuit devices that incorporate or otherwise utilize CMOS, MOSFET, and/or FinFET technology.

Accordingly, at least portions of one or more of the semiconductor structures described herein may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While certain features of the invention have been illustrated and described herein, many modifications, substitutions, changes, and equivalents will now occur to those of ordinary skill in the art. Such changes, modification, and/or alternative embodiments may be made without departing from the spirit of present invention and are hereby all considered within the scope of present invention. It is, therefore, to be understood that the appended claims are intended to cover all such modifications and changes as fall within the spirit of the invention.

What is claimed is:

1. A semiconductor structure comprising:
   a transistor directly on top of a substrate, the transistor has a plurality of nanosheet (NS) channel layers, a metal gate surrounding the plurality of NS channel layers, and a plurality of source/drain (S/D) regions on sidewalls of the plurality of NS channel layers;
   an epitaxial layer on top of the substrate and horizontally adjacent to the transistor, a bottom surface of the epitaxial layer being coplanar with a bottom surface of the metal gate; and
   a continuous contact via being in direct contact with the plurality of S/D regions and with the epitaxial layer, wherein the continuous contact via has a substantially same horizontal distance to each of the plurality of NS channel layers, the plurality of NS channel layers includes a bottom-most NS channel layer of the transistor, and wherein the plurality of S/D regions are a plurality of un-merged silicon-germanium (SiGe) regions epitaxially formed on the sidewalls of the plurality of NS channel layers and are un-merged with the epitaxial layer.

2. The semiconductor structure of claim 1, wherein the continuous contact via comprises a metal via stressor that applies stress towards the plurality of S/D regions on the sidewalls of the plurality of NS channel layers.

3. The semiconductor structure of claim 2, wherein the metal via stressor is tungsten (W), cobalt (Co), ruthenium (Ru), or molybdenum (Mo) next to the plurality of S/D regions on the sidewalls of the plurality of NS channel layers, wherein the W, Co, Ru, or Mo are deposited under a pre-determined condition that results the stress to be a compressive stress or a tensile stress.

4. The semiconductor structure of claim 3, wherein the pre-determined condition comprises a range condition of argon pressure during the deposition of the W, Co, Ru or Mo next to the plurality of S/D regions.

5. The semiconductor structure of claim 1, wherein the plurality of NS channel layers comprises a plurality of silicon (Si) layers, and the plurality of S/D regions comprises a plurality of silicon-germanium (SiGe) regions epitaxially formed on sidewall surfaces of the plurality of Si layers.

6. A method of forming a semiconductor structure comprising:
   forming a transistor directly on top of a substrate;
   forming a plurality of nanosheet (NS) channel layers, a metal gate surrounding the plurality of NS channel layers, and a plurality of source/drain (S/D) regions on sidewalls of the plurality of NS channel layers;
   forming an epitaxial layer on top of the substrate and horizontally adjacent to the transistor, a bottom surface of the epitaxial layer being coplanar with a bottom surface of the metal gate; and
   forming a continuous contact via in direct contact with the plurality of S/D regions and with the epitaxial layer, wherein the continuous contact via has a substantially same horizontal distance to each of the plurality of NS channel layers, the plurality of NS channel layers includes a bottom-most NS channel layer of the transistor, and wherein the plurality of S/D regions are a plurality of un-merged silicon-germanium (SiGe) regions epitaxially formed on the sidewalls of the plurality of NS channel layers and are un-merged with the epitaxial layer.

7. The method of claim 6, wherein forming the continuous contact via comprises depositing tungsten (W), cobalt (Co), ruthenium (Ru), or molybdenum (Mo) in a physical vapor deposition (PVD) process, under a pre-determined condition, directly next to the plurality of S/D regions on the sidewalls of the plurality of NS channel layers such that the continuous contact via exerting a compressive stress or a tensile stress towards the plurality of S/D regions.

8. The method of claim 7, wherein the pre-determined condition comprises a range condition of argon pressure during a PVD process of forming the continuous contact via.

9. The method of claim 6, wherein forming the plurality of NS channel layers comprises forming a plurality of silicon (Si) layers alternatingly stacked with a plurality of silicon-germanium (SiGe) layers and forming inner sidewall spacers at two ends of the plurality of SiGe layers.

10. The method of claim 9, wherein forming the plurality of S/D regions comprises epitaxially growing the plurality of S/D regions on the sidewalls of the plurality of NS channel layers, wherein the plurality of S/D regions are un-merged with each other.

11. The method of claim 10, further comprising forming a merged sacrificial S/D layer covering the plurality of S/D regions.

12. The method of claim 11, further comprising removing the plurality of SiGe layers to expose the plurality of Si layers, forming a gate dielectric layer covering the exposed plurality of Si layers, and forming a gate metal over the gate dielectric layer surrounding the plurality of Si layers.

13. The method of claim 12, further comprising forming a dielectric cap layer on top of the gate metal.

14. The method of claim 12, further comprising removing the merged sacrificial S/D layer to expose the un-merged plurality of S/D regions before forming the continuous contact via.

15. A semiconductor structure comprising:
a transistor on a substrate, the transistor has a plurality of nanosheet (NS) channel layers including a bottom-most NS channel layer of the transistor, a metal gate surrounding the plurality of NS channel layers, and a plurality of un-merged source/drain (S/D) regions at sidewalls of the plurality of NS channel layers;
an epitaxial layer on the substrate and horizontally adjacent to the transistor, the epitaxial layer being un-merged with a S/D region at a sidewall of the bottom-most NS channel layer and a bottom surface of the epitaxial layer being coplanar with a bottom surface of the metal gate; and
a continuous contact via directly next to the plurality of un-merged S/D regions.

16. The semiconductor structure of claim 15, wherein the continuous contact via has a substantially same horizontal distance to each of the plurality of NS channel layers including the bottom-most NS channel layer.

17. The semiconductor structure of claim 16, wherein the continuous contact via comprises a metal via stressor, the metal via stressor being ruthenium (Ru) or molybdenum (Mo) next to the plurality of un-merged S/D regions.

18. The semiconductor structure of claim 17, wherein the metal via stressor applies a stress towards the un-merged S/D regions, and the stress is either a compressive stress or a tensile stress depending on a range condition of argon pressure used during a physical vapor deposition (PVD) process of the continuous contact via.

19. The semiconductor structure of claim 15, wherein the plurality of NS channel layers comprises a plurality of silicon (Si) layers, and the plurality of un-merged S/D regions comprises a plurality of silicon-germanium (SiGe) regions epitaxially formed on sidewall surfaces of the plurality of Si layers.

* * * * *